United States Patent
Amano et al.

(10) Patent No.: US 11,791,171 B2
(45) Date of Patent: Oct. 17, 2023

(54) SUBSTRATE PROCESSING APPARATUS

(71) Applicant: TOKYO ELECTRON LIMITED, Tokyo (JP)

(72) Inventors: Yoshifumi Amano, Fukuoka (JP); Kazuhiro Aiura, Fukuoka (JP)

(73) Assignee: TOKYO ELECTRON LIMITED, Tokyo (JP)

(*) Notice: Subject to any disclaimer, the term of this patent is extended or adjusted under 35 U.S.C. 154(b) by 64 days.

(21) Appl. No.: 16/892,321

(22) Filed: Jun. 4, 2020

(65) Prior Publication Data

US 2020/0388511 A1    Dec. 10, 2020

(30) Foreign Application Priority Data

Jun. 5, 2019 (JP) ................. 2019-104933
Apr. 2, 2020 (JP) ................. 2020-066415

(51) Int. Cl.
*H01L 21/67* (2006.01)
*H01L 21/306* (2006.01)
*B01D 45/00* (2006.01)
*B01D 47/00* (2006.01)
*H01L 21/683* (2006.01)

(52) U.S. Cl.
CPC ........ *H01L 21/67017* (2013.01); *B01D 45/00* (2013.01); *B01D 47/00* (2013.01); *H01L 21/306* (2013.01); *H01L 21/6838* (2013.01)

(58) Field of Classification Search
CPC ............ H01L 21/67017; H01L 21/306; H01L 21/6838; B01D 45/00; B01D 47/00
USPC ..................... 134/153, 33, 94, 902
See application file for complete search history.

(56) References Cited

U.S. PATENT DOCUMENTS

| | | | | |
|---|---|---|---|---|
| 5,626,675 | A * | 5/1997 | Sakamoto | H01L 21/68707 118/663 |
| 6,417,117 | B1 * | 7/2002 | Davis | B05C 11/08 438/782 |
| 7,793,610 | B2 * | 9/2010 | Akimoto | H01L 21/67051 118/52 |
| 8,539,906 | B2 * | 9/2013 | Ogata | H01L 21/67051 118/326 |
| 2008/0078428 | A1 * | 4/2008 | Yoshida | H01L 21/67051 134/104.2 |
| 2008/0110041 | A1 * | 5/2008 | Ehlers | D06F 58/48 34/513 |
| 2013/0008872 | A1 * | 1/2013 | Higashuima | H01L 21/67051 216/92 |

FOREIGN PATENT DOCUMENTS

JP    2009-295803 A    12/2009

* cited by examiner

*Primary Examiner* — Joel D Crandall
*Assistant Examiner* — Shantese L McDonald
(74) *Attorney, Agent, or Firm* — XSENSUS LLP

(57) ABSTRACT

A substrate processing apparatus according to an aspect of the present disclosure includes a substrate rotating unit, a gas-liquid separator, and an exhaust route. The substrate rotating unit is configured to hold and rotate a substrate. The gas-liquid separator is provided so as to surround an outer circumference of the substrate rotating unit to separate gas and liquid droplets. The exhaust route is provided so as to surround an outer circumference of the gas-liquid separator and discharges the gas separated by the gas-liquid separator.

10 Claims, 14 Drawing Sheets

SUBSTRATE PROCESSING APPARATUS

CROSS-REFERENCE TO RELATED APPLICATIONS

The present application claims priority to and incorporates by reference the entire contents of Japanese Patent Application No. 2019-104933 filed in Japan on Jun. 5, 2019 and Japanese Patent Application No. 2020-66415 filed in Japan on Apr. 2, 2020.

FIELD

Exemplary embodiments disclosed herein relate to a substrate processing apparatus.

BACKGROUND

Conventionally, a technique of etching a peripheral edge of a substrate such as a semiconductor wafer (hereinafter, also referred to as wafer) with processing liquid has been known. Japanese Laid-open Patent Publication No. 2009-295803 discloses a technique of etching a peripheral edge of a substrate with processing liquid.

SUMMARY

A substrate processing apparatus according to an aspect of the present disclosure includes a substrate rotating unit, a gas-liquid separator, and an exhaust route. The substrate rotating unit is configured to hold and rotate a substrate. The gas-liquid separator is provided so as to surround an outer circumference of the substrate rotating unit to separate gas and liquid droplets. The exhaust route is provided so as to surround an outer circumference of the gas-liquid separator and discharges the gas separated by the gas-liquid separator.

DESCRIPTION OF EMBODIMENTS

Figure 1:
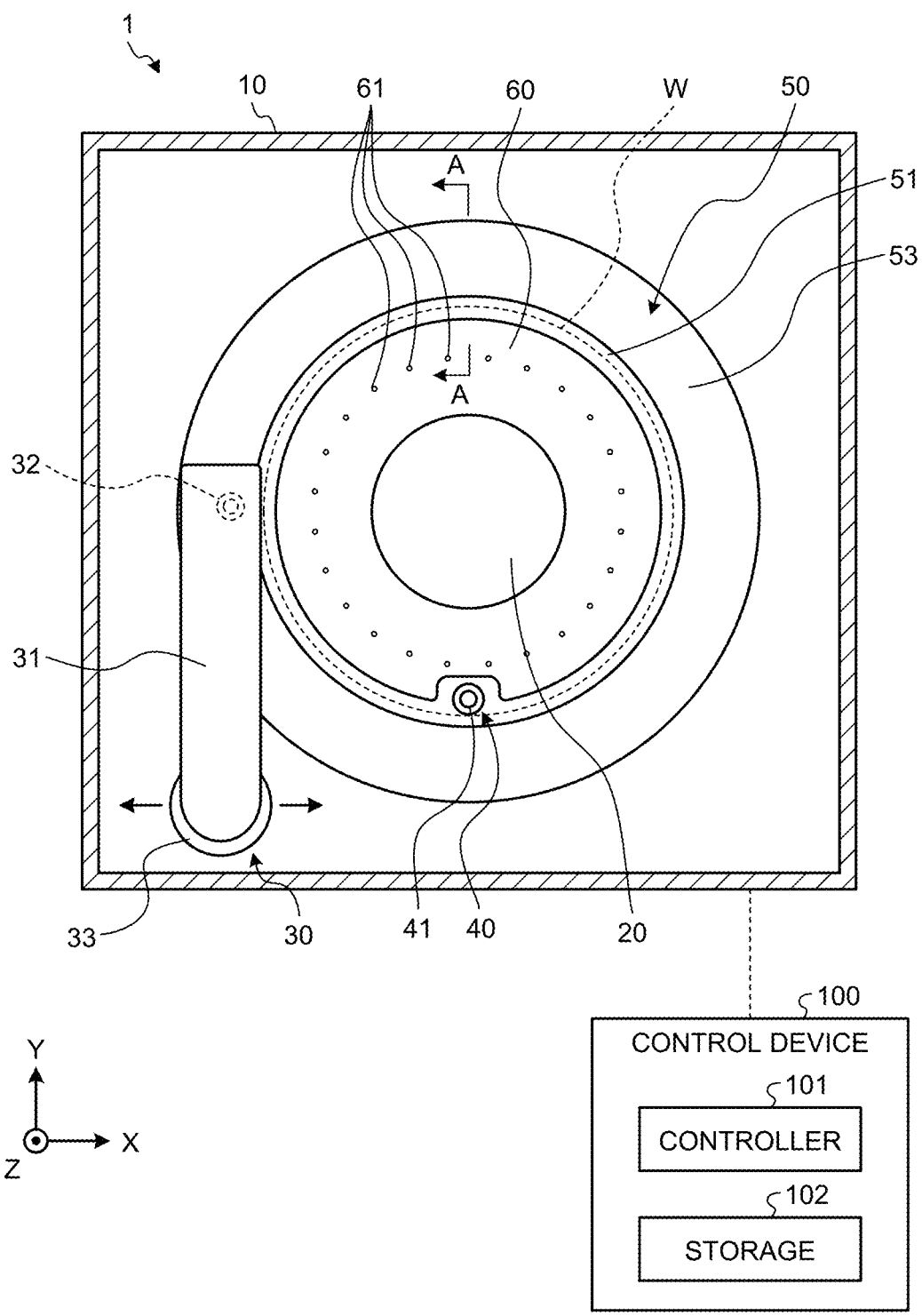
FIG. 1 is a schematic view illustrating the configuration of a substrate processing apparatus according to a first embodiment.

Exemplary embodiments of a substrate processing apparatus disclosed in the present application will be explained below in detail with reference to the accompanying drawings. The present invention is not limited to the embodiments explained below. It should be noted that the drawings are schematic and relations of dimensions among components, ratios of the components, and the like are different from actual ones in some cases. Furthermore, among the drawings, the relations of the dimensions and the ratios may be different in some parts.

In the following embodiments, the same reference signs denote the same elements and overlapped explanation thereof is omitted. In the drawings to be referred to below, a Cartesian coordinate system in which an X-axis direction, a Y-axis direction, and a Z-axis direction orthogonal to one another are defined and a positive Z-axis direction is an upward vertical direction is indicated in some cases for the convenience of explanation. A rotating direction about a vertical axis as a rotating center is referred to as a θ direction in some cases.

A technique of etching a peripheral edge of a substrate such as a semiconductor wafer (hereinafter, also referred to as a wafer) with processing liquid has been conventionally known. In the etching process on the peripheral edge, high-speed rotation of the substrate can make swirl flow flowing from the inner side of a substrate surface to the outer side thereof faster, thereby preventing spattering of liquid droplets of an etchant to the inner side of the peripheral edge.

That is to say, in the etching process on the peripheral edge, etching accuracy of the peripheral edge can be improved by rotating the substrate at high speed.

The conventional substrate processing apparatus discharges mixed gas in which gas and liquid droplets are mixed through an exhaust route from a cup provided around the substrate and separates the mixed gas into the gas and the liquid droplets in a gas-liquid separator provided on the exhaust route. Thereafter, the gas separated from the liquid droplets is discharged to the outside through an exhaust port.

On the other hand, in the conventional substrate processing apparatus, pressure loss in a flow channel formed from the inside of the cup to the exhaust port is large. For this reason, when the substrate is rotated at high speed, the flow of the gas in the cap is increased in speed with the swirl flow and it is difficult to smoothly discharge the gas to the exhaust port. Accordingly, the conventional technique has a difficulty in rotating the substrate at high speed, and improvement in the etching accuracy of the peripheral edge is therefore difficult.

A technique capable of solving the above-mentioned problem and etching the peripheral edge of the substrate with high accuracy is therefore expected.

Overall Configuration of Substrate Processing Apparatus

Figure 2:
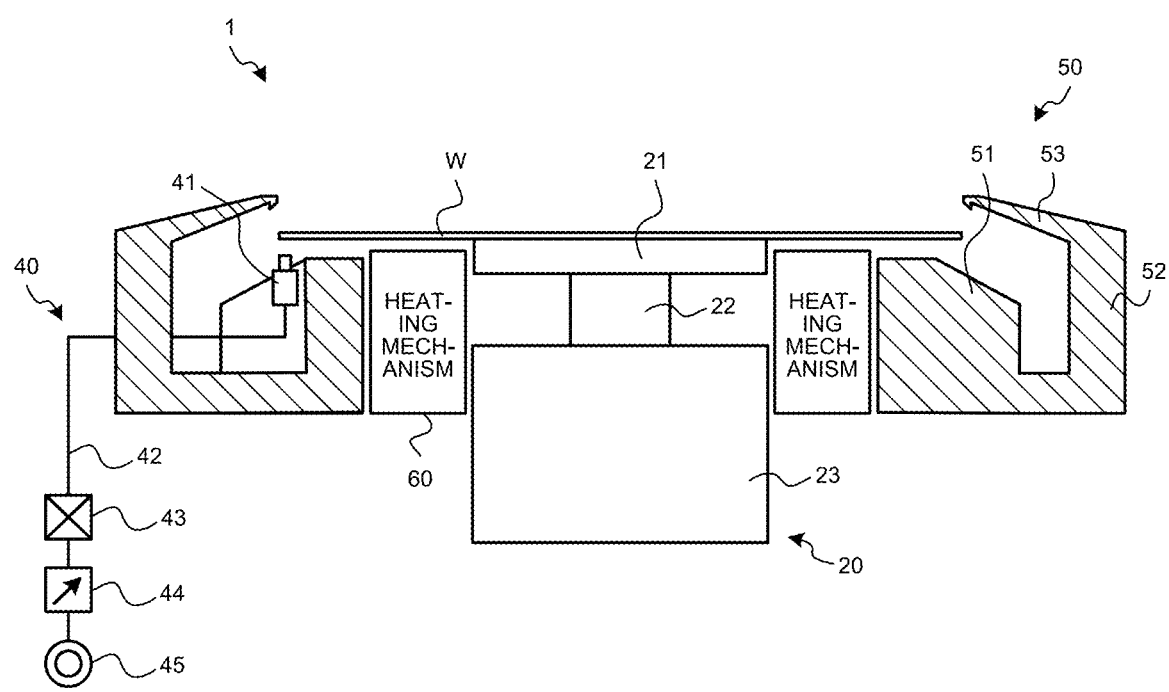
FIG. 2 is a schematic view illustrating the configuration of the substrate processing apparatus in the first embodiment.

First, the configuration of a substrate processing apparatus 1 according to a first embodiment will be explained with reference to FIGS. 1 and 2. FIGS. 1 and 2 are schematic views illustrating the configuration of the substrate processing apparatus 1 in the first embodiment.

As illustrated in FIGS. 1 and 2, the substrate processing apparatus 1 in the first embodiment includes a processing container 10, a substrate rotating unit 20, an upper surface supply unit 30, a lower surface supply unit 40, a recovery unit 50, and a heating mechanism 60.

The processing container 10 accommodates therein the substrate rotating unit 20, the upper surface supply unit 30, the lower surface supply unit 40, the recovery unit 50, and the heating mechanism 60.

The substrate rotating unit 20 is configured to hold a wafer W in a rotatable manner. To be specific, as illustrated in FIG. 2, the substrate rotating unit 20 includes a vacuum chuck 21, a shaft unit 22, and a driving unit 23. The vacuum chuck 21 is configured to adsorb and hold the wafer W by evacuation. The vacuum chuck 21 has a diameter that is smaller than that of the wafer W, and is configured to adsorb and hold a lower surface center part of the wafer W.

The shaft unit 22 horizontally supports the vacuum chuck 21 on the leading end thereof. The driving unit 23 is connected to the bottom end of the shaft unit 22. The driving unit 23 rotates the shaft unit 22 about a vertical axis and lifts and lowers the shaft unit 22 and the vacuum chuck 21 supported on the shaft unit 22.

As illustrated in FIG. 1, the upper surface supply unit 30 supplies processing liquid to an upper surface peripheral edge of the wafer W to etch the upper surface peripheral edge of the wafer W. With the etching, for example, a film formed on the upper surface peripheral edge of the wafer W can be removed or the upper surface peripheral edge of the wafer W can be washed.

The upper surface peripheral edge of the wafer W is an annular region having the width of, for example, about 1 to 5 mm from the end surface thereof on the upper surface of the wafer W.

The upper surface supply unit 30 includes a nozzle arm 31, a nozzle 32, and a movement mechanism 33. The nozzle arm 31 extends in a horizontal direction (in this example, the Y-axis direction) and supports the nozzle 32 on the leading end thereof.

The nozzle 32 is arranged in a state in which a discharge port faces downward above the wafer W and discharges the processing liquid such as chemical liquid and rinse liquid onto the upper surface of the wafer W. Examples of the chemical liquid that can be used include hydrofluoric acid (HF), dilute hydrofluoric acid (DHF), and nitric-hydrofluoric acid. The nitric-hydrofluoric acid is a mixed solution of hydrofluoric acid (HF) and nitric acid ($HNO_3$). Examples of the rinse liquid that can be used include deionized water (DIW).

The movement mechanism 33 is connected to the bottom end of the nozzle arm 31. The movement mechanism 33 moves the nozzle arm 31 along the horizontal direction (in this example, the X-axis direction), for example.

The lower surface supply unit 40 supplies the processing liquid to a lower surface peripheral edge of the wafer W to etch the lower surface peripheral edge of the wafer W. With the etching, for example, a film formed on the lower surface peripheral edge of the wafer W can be removed or the lower surface peripheral edge of the wafer W can be washed.

The lower surface peripheral edge of the wafer W is an annular region having the width of, for example, about 1 to 5 mm from the end surface thereof on the lower surface of the wafer W.

As illustrated in FIG. 2, the lower surface supply unit 40 includes a lower surface nozzle 41, a pipe 42, a valve 43, a flow controller 44, and a processing liquid supply source 45. The lower surface nozzle 41 is arranged below the wafer W and discharges upward the processing liquid toward the lower surface peripheral edge of the wafer W.

The pipe 42 connects the lower surface nozzle 41 and the processing liquid supply source 45. The valve 43 is provided halfway of the pipe 42 and opens and closes the pipe 42. The flow controller 44 is provided halfway of the pipe 42 and controls the flow of the processing liquid flowing through the pipe 42. The processing liquid supply source 45 is, for example, a tank storing therein the processing liquid.

The lower surface supply unit 40 may include a movement mechanism that moves the lower surface nozzle 41 in the horizontal direction. In this case, the lower surface supply unit 40 can move the lower surface nozzle 41 between a processing position below the wafer W and a retreat position on the outer side of the wafer W.

The recovery unit 50 is provided so as to surround an outer part of the wafer W and recovers the liquid droplets of the processing liquid spattering from the wafer W. In the first embodiment, the recovery unit 50 has a lower cup 51, a side cup 52, and an upper cup 53 in order to receive the liquid droplets spattering from the wafer W without leakage.

The lower cup 51 is an annular part arranged on the outer side of the heating mechanism 60 so as to cover a lower part of the peripheral edge of the wafer W. The side cup 52 is an annular part provided so as to surround a side part of the wafer W. The upper cup 53 is an annular part provided so as to surround an upper part on the outer side of the wafer W.

The lower cup 51, the side cup 52, and the upper cup 53 are formed by members having high chemical resistance such as fluorine resin exemplified by polytetrafluoroethylene (PTFE) and perfluoroalkoxy alkane (PFA).

The substrate processing apparatus 1 uses a pump 70 (see FIG. 3) to efficiently recover the liquid droplets spattering from the surroundings of the wafer W by sucking the gas around the wafer W from the recovery unit 50. Details of a gas suction mechanism will be described later.

The heating mechanism 60 is arranged below the wafer W on the outer side of the substrate rotating unit 20. To be specific, the heating mechanism 60 is arranged between the substrate rotating unit 20 and the lower cup 51.

The heating mechanism 60 heats the lower surface peripheral edge of the wafer W by supplying heated fluid to the lower surface of the wafer W held by the substrate rotating unit 20. To be specific, as illustrated in FIG. 1, the heating mechanism 60 includes a plurality of discharge ports 61 arranged side by side in the circumferential direction of the wafer W and supplies the heated fluid to the lower surface of the wafer W through the discharge ports 61.

The substrate processing apparatus 1 in the first embodiment includes a control device 100. The control device 100 is, for example, a computer and includes a controller 101 and a storage 102.

The storage 102 is implemented by, for example, a semiconductor memory device such as a random-access memory (RAM) and a flash memory or a storage device such as a hard disk and an optical disc. The storage 102 stores therein a computer program for controlling various pieces of processing that the substrate processing apparatus 1 executes.

The controller 101 includes a microcomputer having a central processing unit (CPU), a read-only memory (ROM), the RAM, and an input/output port, and various circuits. The controller 101 controls operations of the substrate processing apparatus 1 by reading and executing the computer program stored in the storage 102.

The computer program may be recorded in a computer-readable storage medium and be installed in the storage 102 of the control device 100 from the storage medium. Examples of the computer-readable storage medium include a hard disk (HD), a flexible disk (FD), a compact disc (CD), a magneto-optical disk (MO), and a memory card.

Configuration of Recovery Unit (First Embodiment)

Figure 3:
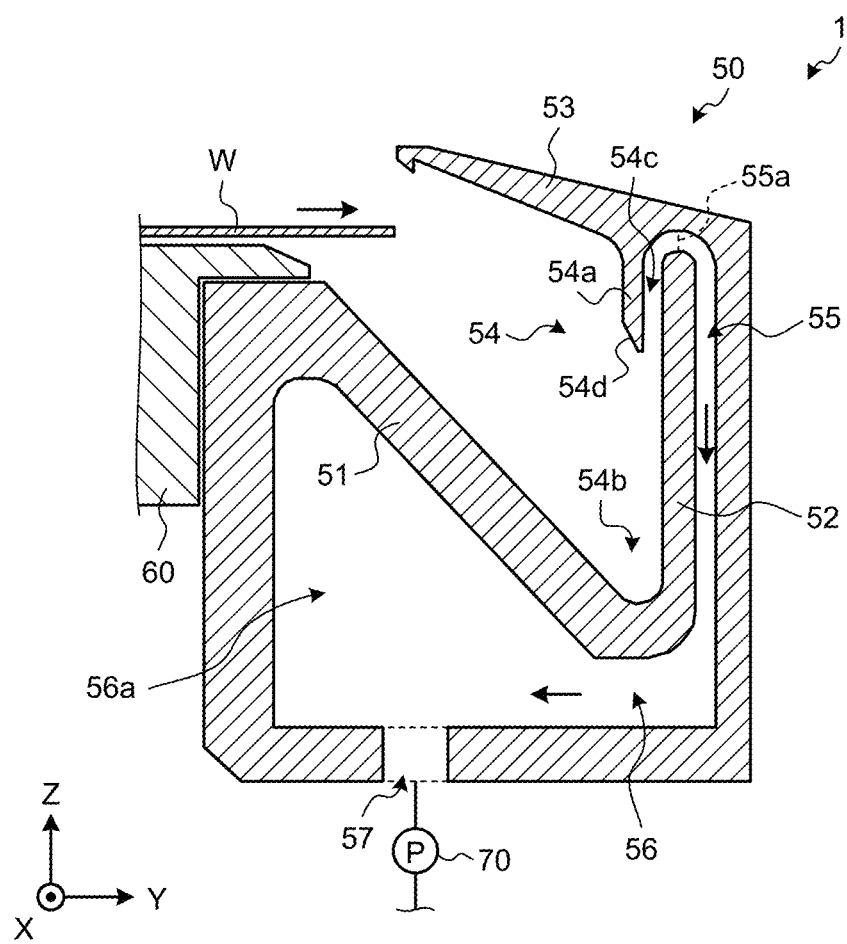
FIG. 3 is a cross-sectional view illustrating the configuration of a recovery unit in the first embodiment.

Next, the specific configuration of the recovery unit 50 will be explained with reference to FIGS. 3 to 5. FIG. 3 is a cross-sectional view illustrating the configuration of the recovery unit 50 in the first embodiment. To be specific, FIG. 3 is a cross-sectional view cut along line A-A in FIG. 1.

As illustrated in FIG. 3, the recovery unit 50 includes the lower cup 51, the side cup 52, the upper cup 53, a gas-liquid separator 54, an exhaust route 55, a connection route 56, and an exhaust port 57. The pump 70 is connected to the exhaust port 57.

The substrate processing apparatus 1 operates the pump 70 to exhaust gas from a region surrounded by a cup member configured by the lower cup 51, the side cup 52, and the upper cup 53 through the gas-liquid separator 54, the exhaust route 55, the connection route 56, and the exhaust port 57. The substrate processing apparatus 1 can thereby exhaust the gas from the surroundings of the wafer W through the cup member.

The lower cup 51 is provided so as to cover the lower part of the peripheral edge of the wafer W. The lower cup 51 is inclined to be lower toward the outer side (that is, as is closer to the side cup 52). In the first embodiment, an inclined surface of the lower cup 51 is inclined substantially uniformly over the entire region.

The side cup 52 is provided so as to surround the side part on the outer side of the wafer W. The side cup 52 vertically stands from the outer end of the lower cup 51 to the height that is substantially flush with the wafer W.

The upper cup 53 is provided so as to surround the upper part on the outer side of the wafer W. The upper cup 53 is inclined to be higher toward the inner side (that is, as is closer to the wafer W) from the upper end of the side cup 52.

The gas-liquid separator 54 separates the liquid droplets and the gas of the processing liquid received by the lower cup 51, the side cup 52, and the upper cup 53 of the recovery unit 50. The gas-liquid separator 54 is provided in a region surrounded by the cup member configured by the lower cup 51, the side cup 52, and the upper cup 53. That is to say, the gas-liquid separator 54 is provided on the side closer to the substrate rotating unit 20 relative to the inner wall of the side cup 52 so as to surround the outer circumference of the substrate rotating unit 20 (FIG. 2).

The gas-liquid separator 54 has a gas-liquid separating plate 54a, a liquid droplet discharge section 54b, a gas discharge section 54c, and a tapered surface 54d. The gas-liquid separating plate 54a extends downward from the upper cup 53 in the vicinity of an entrance 55a of the exhaust route 55 so as to separate the substrate rotating unit 20 and the entrance 55a of the exhaust route 55.

In the first embodiment, the liquid droplets together with the gas can be prevented from flowing into the exhaust route 55 by providing the gas-liquid separating plate 54a on the upstream side of the exhaust route 55.

The liquid droplet discharge section 54b is an upward-recessed region in which the outer end of the lower cup 51 and the lower end of the side cup 52 are connected to each other. The liquid droplet discharge section 54b is located at a lowermost position in the region surrounded by the cup member configured by the lower cup 51, the side cup 52, and the upper cup 53.

With this configuration, all the liquid droplets received by the lower cup 51, the side cup 52, the upper cup 53, and the gas-liquid separating plate 54a drop onto the liquid droplet discharge section 54b. The substrate processing apparatus 1 discharges the liquid droplets that have dropped onto the liquid droplet discharge section 54b by using a discharge mechanism (not illustrated).

The gas discharge section 54c is a region provided between the gas-liquid separating plate 54a and the side cup 52 and extending to the upper side toward the entrance 55a of the exhaust route 55 from the vicinity of the lower end of the gas-liquid separating plate 54a. The gas discharge section 54c extends upward and can therefore easily discharge gas having a small specific gravity to the exhaust route 55 while preventing the liquid droplets having a large specific gravity from being discharged to the exhaust route 55.

The tapered surface 54d is provided on the leading end of the gas-liquid separating plate 54a. In the first embodiment, the tapered surface 54d is provided on the surface of the gas-liquid separating plate 54a on the side of the substrate rotating unit 20. The gas can flow smoothly toward the exhaust route 55 from the surroundings of the wafer W by providing the tapered surface 54d.

The exhaust route 55 is connected to the downstream side of the gas-liquid separator 54 and discharges the gas separated from the liquid droplets by the gas-liquid separator 54. The exhaust route 55 extends vertically downward in the side cup 52 from the entrance 55a formed at an upper position inside the side cup 52. That is to say, the exhaust route 55 is provided so as to surround the outer circumference of the gas-liquid separator 54 located on the inner side of the side cup 52.

The connection route 56 is connected to the downstream side of the exhaust route 55. The connection route 56, for example, extends inward from the lower end of the exhaust route 55 in the lower cup 51. The connection route 56 has a buffer 56a located below the lower cup 51 and configured to temporarily hold the exhaust gas.

The exhaust port 57 is connected to the downstream side of the connection route 56. The exhaust port 57 is provided at a predetermined position below the buffer 56a, for example. One exhaust port 57 may be provided in the connection route 56 or a plurality of exhaust ports 57 may be provided therein. Details of an exhaust duct 80 (see FIG. 12) on the downstream side of the exhaust port 57 will be described later.

As described above, in the recovery unit 50 in the first embodiment, the gas-liquid separator 54 is provided so as to surround the wafer W in a region surrounded by the cup member (the lower cup 51, the side cup 52, and the upper cup 53) receiving the liquid droplets spattering from the wafer W. In the recovery unit 50 in the first embodiment, the exhaust route 55 is provided on the downstream side of the gas-liquid separator 54 so as to surround the outer circumference of the gas-liquid separator 54.

As described above, in the first embodiment, the gas-liquid separator 54 having large pressure loss is provided in the vicinity of the cup member, and the exhaust route 55 having smaller pressure loss than the gas-liquid separator 54 is provided on the downstream side of the gas-liquid separator 54. The gas can be efficiently exhausted from the surroundings of the wafer W and the region surrounded by the cup member.

According to the first embodiment, the gas can therefore be smoothly discharged to the exhaust port 57 even when the flow of the gas in the cup member is increased in speed by the high-speed rotation of the wafer W.

Figure 4:
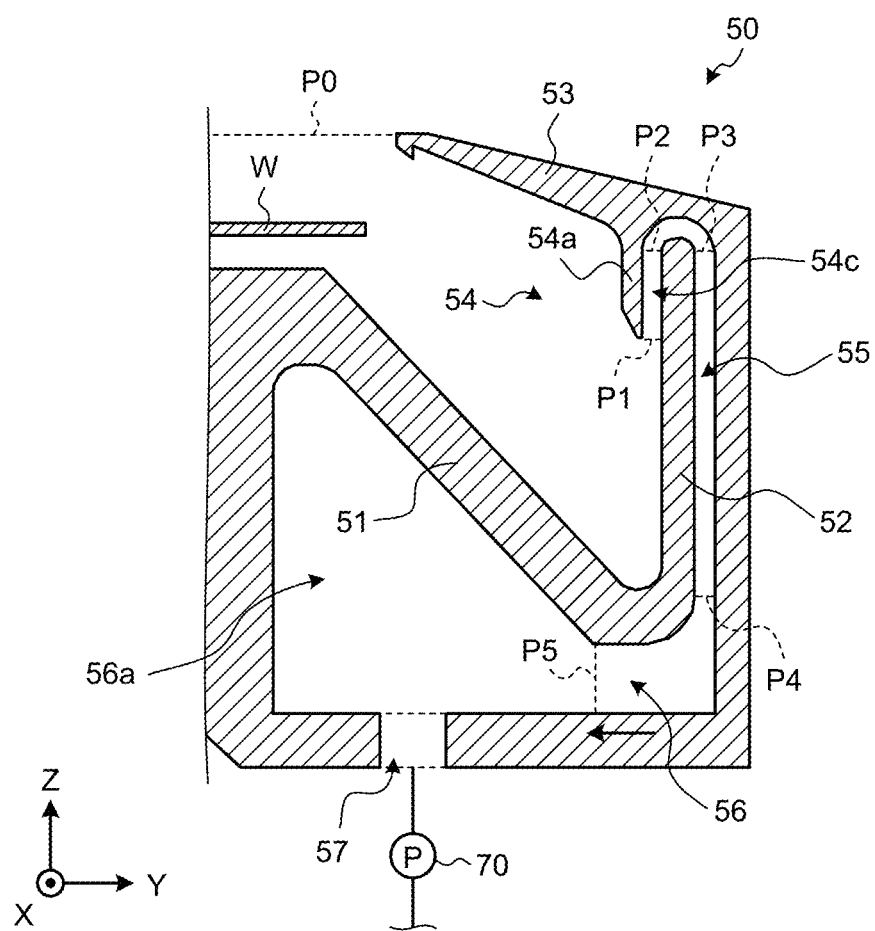
FIG. 4 is a view illustrating evaluation places of total pressure in the recovery unit in the first embodiment.
Figure 5:
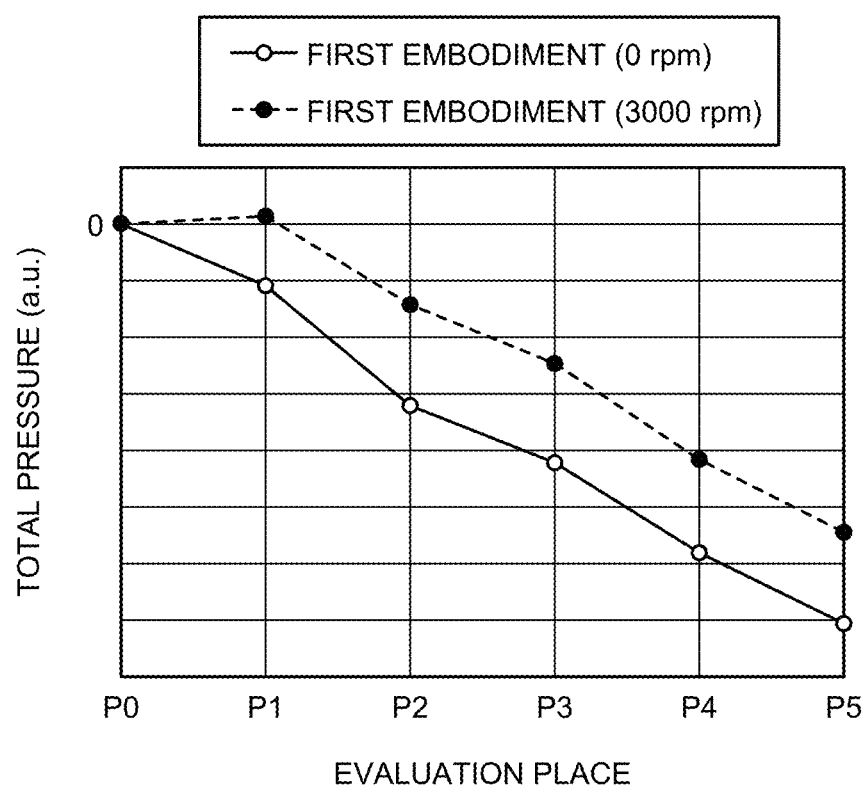
FIG. 5 is a graph illustrating shift of the total pressure in the recovery unit in the first embodiment.

FIGS. 4 and 5 illustrate a specific simulation result of exhaust efficiency of the recovery unit 50 in the first embodiment. FIG. 4 is a view illustrating evaluation places of total pressure in the recovery unit 50 in the first embodiment, and FIG. 5 is a graph illustrating shift of the total pressure in the recovery unit 50 in the first embodiment.

The exhaust efficiency of the recovery unit 50 in the first embodiment was evaluated at evaluation places P0 to P5 illustrated in FIG. 4. As illustrated in FIG. 4, the evaluation place P0 is at the uppermost-stream position in a flow channel and the evaluation place P5 is at the lowermost-stream position in the flow channel. All of evaluation results, which will be described below, are relative values when the total pressure at the evaluation place P0 is zero.

The recovery unit 50 in the first embodiment can efficiently exhaust the gas from the surroundings of the wafer W and the region surrounded by the cup member. Accordingly, as illustrated in FIG. 5, when the wafer W is rotated at high speed (3000 rpm), the pressure loss can be reduced (that is, the total pressure can be increased) as compared with the case in which the wafer W is not rotated (0 rpm).

In the first embodiment, even when the wafer W is rotated at high speed in the etching process on the peripheral edge of the wafer W, the gas the flow of which is increased by the high-speed rotation can be exhausted with no problem. That is to say, in the first embodiment, the wafer W can be rotated at high speed in the etching process on the peripheral edge of the wafer W.

With this configuration, according to the first embodiment, the liquid droplets of the etchant can be prevented from spattering to the inner side of the peripheral edge, thereby etching the peripheral edge of the wafer W with high accuracy.

In the first embodiment, the gas-liquid separator 54 is provided in the region surrounded by the cup member, so that a region contaminated by the liquid droplets can be limited to the inside of the cup member. Accordingly, in the first embodiment, the recovery unit 50 can be easily washed simply by removing the liquid droplets that have adhered to the recovery unit 50.

As illustrated in FIG. 3, in the first embodiment, the gas-liquid separator 54 has the gas-liquid separating plate 54a extending downward so as to separate the substrate rotating unit 20 and the entrance 55a of the exhaust route 55. With the gas-liquid separating plate 54a, the liquid droplets that hit the upper cup 53 or flow directly toward the entrance 55a of the exhaust route 55 can be prevented from entering the entrance 55a.

According to the first embodiment, the liquid droplets that hit the upper cup 53 or flow directly toward the entrance 55a of the exhaust route 55 can therefore be separated preferably.

Furthermore, in the first embodiment, the lower end of the gas-liquid separating plate 54a is preferably provided at a position lower than the lower end of the entrance 55a of the exhaust route 55. With this positioning, the liquid droplets that hit the upper cup 53 or flow directly toward the entrance 55a of the exhaust route 55 can be prevented from entering the entrance 55a efficiently.

According to the first embodiment, the liquid droplets that hit the upper cup 53 or flow directly toward the entrance 55a of the exhaust route 55 can therefore be separated more preferably.

Figure 6:
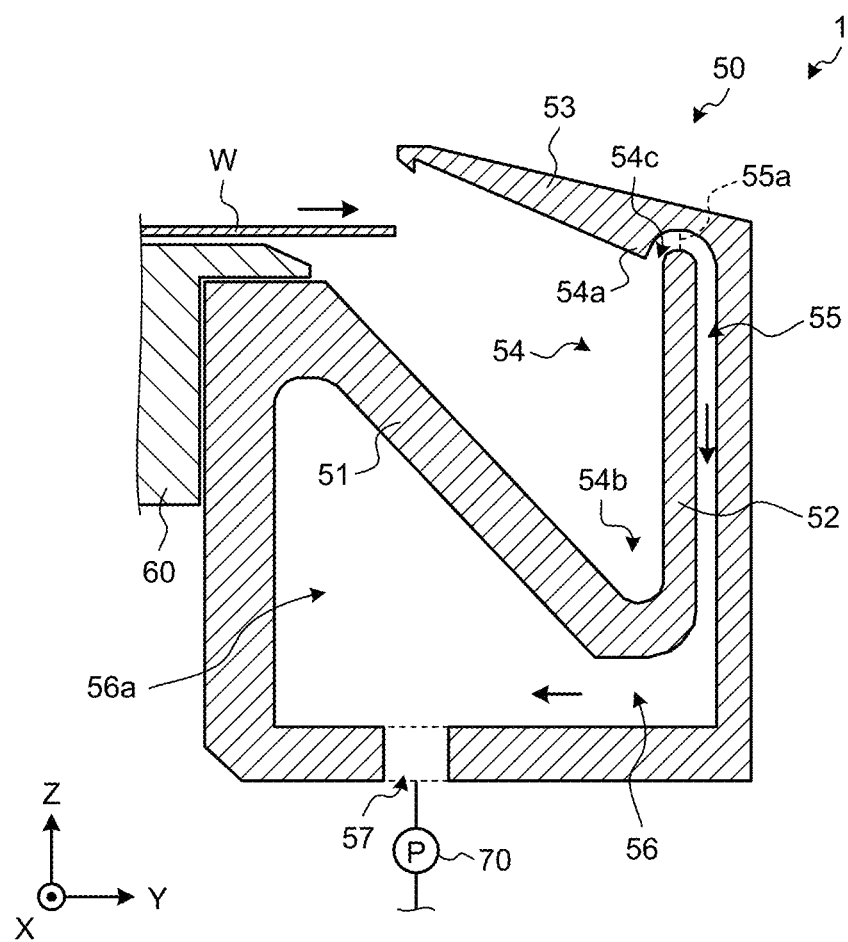
FIG. 6 is a cross-sectional view illustrating the configuration of a recovery unit according to a first alternative example of the first embodiment.

Arrangement of the gas-liquid separating plate 54a is not limited to the example illustrated in FIG. 3. FIG. 6 is a cross-sectional view illustrating the configuration of the recovery unit 50 according to a first alternative example of the first embodiment. As illustrated in FIG. 6, the lower end of the gas-liquid separating plate 54a may be provided at a position that is slightly lower than the lower end of the entrance 55a of the exhaust route 55.

Figure 7:
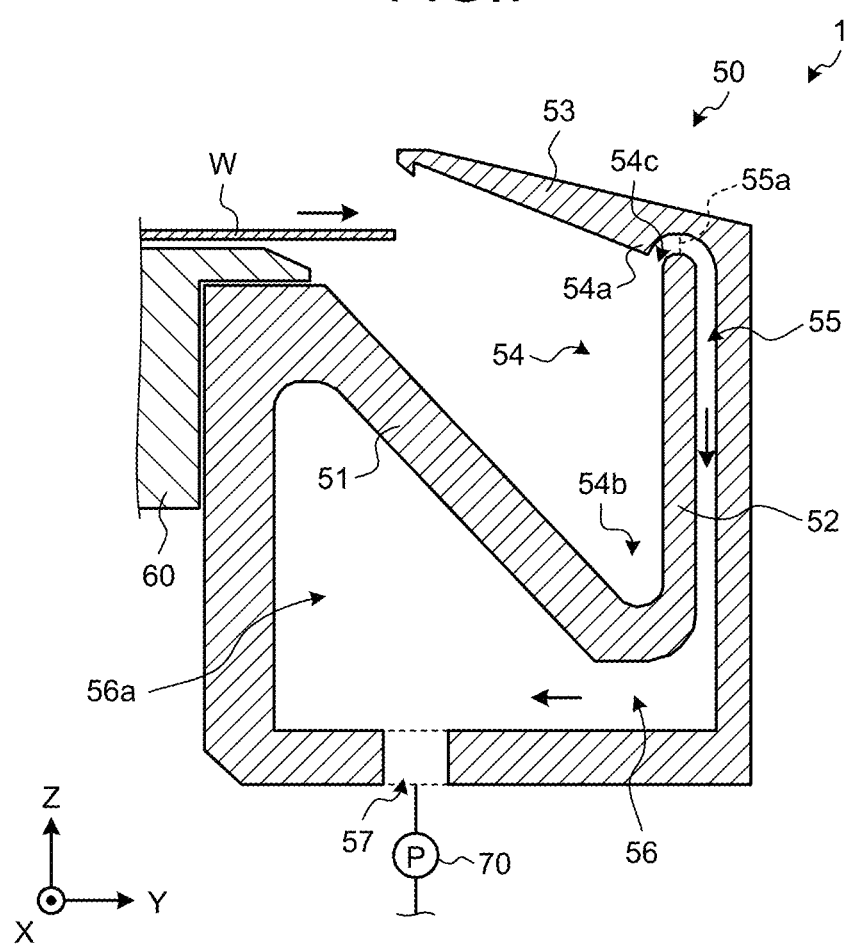
FIG. 7 is a cross-sectional view illustrating the configuration of a recovery unit according to a second alternative example of the first embodiment.

FIG. 7 is a cross-sectional view illustrating the configuration of the recovery unit 50 according to a second alternative example of the first embodiment. As illustrated in FIG. 7, the lower end of the gas-liquid separating plate 54a may be provided so as to be flush with the lower end of the entrance 55a of the exhaust route 55.

Even with the examples in FIGS. 6 and 7, the liquid droplets that hit the upper cup 53 or flow directly toward the entrance 55a of the exhaust route 55 can be separated preferably. In the disclosure, the expression "flush" includes the case of a substantially flush state. That is to say, in the disclosure, the expression "flush" includes the case in which they are not located on the completely same horizontal plane.

As illustrated in FIG. 3, in the first embodiment, it is preferable that the exhaust route 55 extend vertically from the entrance 55a. Vertical extension of the exhaust route 55 in this manner can decrease the outer diameter of the side cup 52 in which the exhaust route 55 is provided in comparison with the case in which the exhaust route 55 extends in the oblique direction.

According to the first embodiment, the recovery unit 50 can be reduced in size. In the disclosure, the expression "vertically" includes the case of a substantially vertical state. That is to say, in the disclosure, the expression "vertically" includes the case in which it is not completely perpendicular to the horizontal plane.

In the first embodiment, it is preferable that the cross-sectional area of the connection route 56 be larger than the cross-sectional area of the exhaust route 55. That is to say, in the first embodiment, the pressure loss generated in the exhaust route 55 is preferably larger than the pressure loss generated in the connection route 56.

When the pressure loss generated in the exhaust route 55 is made larger than the pressure loss generated in the connection route 56, the gas in the region surrounded by the cup member can be discharged uniformly over the entire circumference of the exhaust route 55. According to the embodiment, the speed of the swirl flow flowing through the peripheral edge of the wafer W can be made uniform over the entire circumference, thereby etching the peripheral edge of the wafer W with higher accuracy.

In the first embodiment, the gas-liquid separator 54 is provided to be close to the side cup 52, and the exhaust route 55 and the connection route 56 for exhausting the gas from the gas-liquid separator 54 are provided in the cup member.

Provision of the gas-liquid separator 54, the exhaust route 55, and the connection route 56 to be close to the cup member in this manner can reduce the length of the entire exhaust route from the surroundings of the wafer W to the pump 70. According to the first embodiment, flow channel resistance of the entire exhaust route from the surroundings of the wafer W to the pump 70 can therefore be reduced.

Second Embodiment

Figure 8:
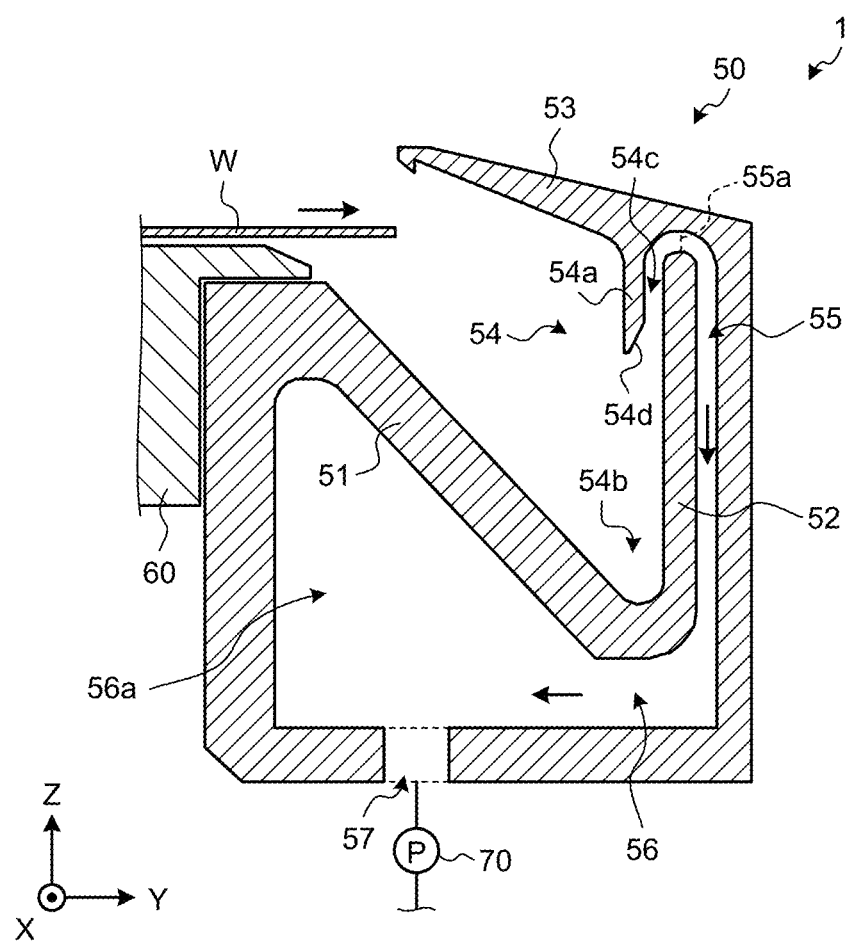
FIG. 8 is a cross-sectional view illustrating the configuration of a recovery unit according to a second embodiment.

Next, the specific configuration of the recovery unit 50 according to a second embodiment will be explained with reference to FIGS. 8 to 10. FIG. 8 is a cross-sectional view illustrating the configuration of the recovery unit 50 in the second embodiment. As illustrated in FIG. 8, the recovery unit 50 in the second embodiment is different from the first embodiment in arrangement of the tapered surface 54d provided on the gas-liquid separating plate 54a.

To be specific, in the second embodiment, the tapered surface 54d is provided on the surface of the gas-liquid separating plate 54a on the side of the exhaust route 55. Thus, the gas can flow smoothly toward the entrance 55a of the exhaust route 55 from the vicinity of the leading end of the gas-liquid separating plate 54a by providing the tapered surface 54d on the surface of the gas-liquid separating plate 54a on the side of the exhaust route 55.

Figure 9:
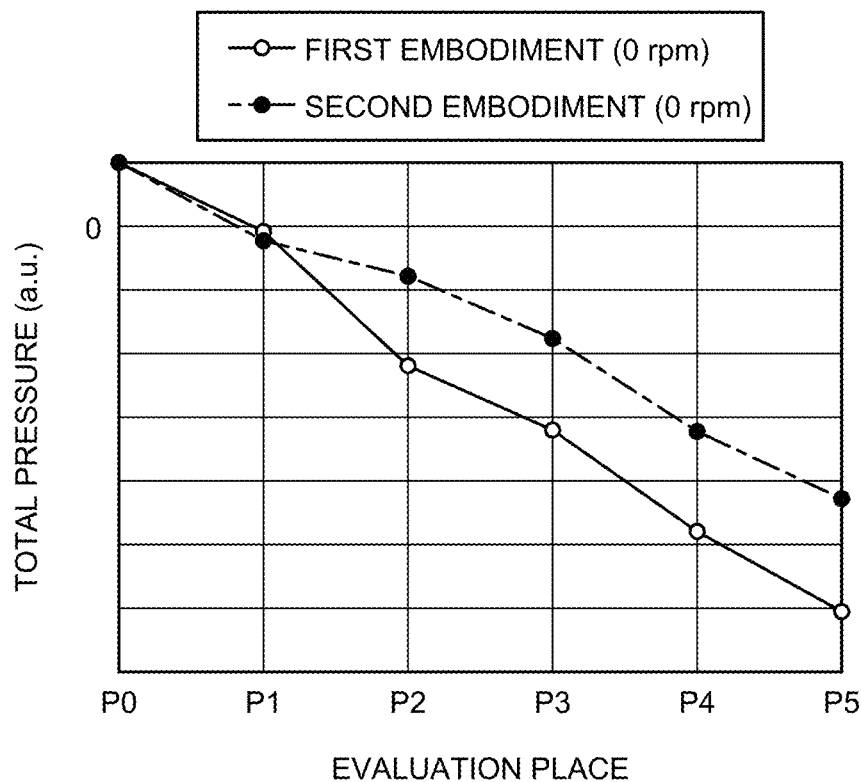
FIG. 9 is a graph illustrating shift of total pressure in the recovery unit in the second embodiment.
Figure 10:
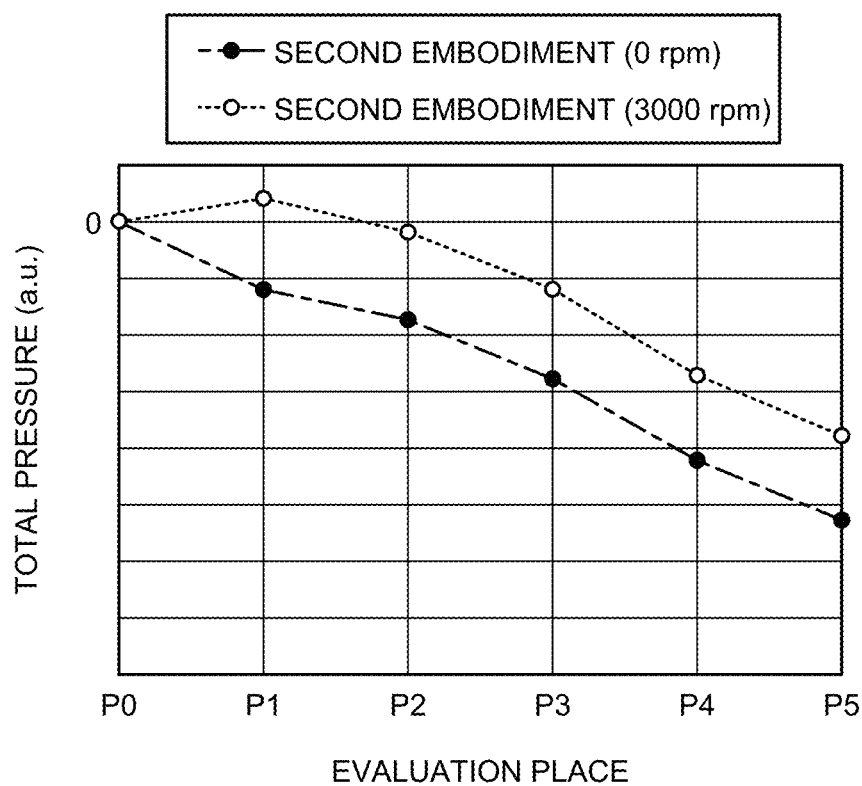
FIG. 10 is a graph illustrating shift of the total pressure in the recovery unit in the second embodiment.

FIGS. 9 and 10 each illustrate a specific simulation result of exhaust efficiency of the recovery unit 50 in the second embodiment. FIGS. 9 and 10 are graphs illustrating shift of the total pressure in the recovery unit 50 in the second embodiment.

As illustrated in FIG. 9, the recovery unit 50 in the second embodiment can reduce the pressure loss in comparison with the recovery unit 50 in the first embodiment. The recovery unit 50 in the second embodiment can efficiently exhaust the gas from the surroundings of the wafer W and the region surrounded by the cup member. Accordingly, as illustrated in FIG. 10, when the wafer W is rotated at high speed, the pressure loss can be reduced as compared with the case in which the wafer W is not rotated.

As described above, in the second embodiment, even when the wafer W is rotated at high speed in the etching process on the peripheral edge of the wafer W, the gas the flow of which is further increased by the high-speed rotation can be exhausted more smoothly. That is to say, in the second embodiment, the wafer W can be rotated at higher speed in the etching process on the peripheral edge of the wafer W.

With this configuration, according to the second embodiment, the liquid droplets of the etchant can be further prevented from spattering to the inner side of the peripheral edge, thereby etching the peripheral edge of the wafer W with higher accuracy.

In the example of FIG. 8, the tapered surface 54d is provided on only the surface of the gas-liquid separating plate 54a on the side of the exhaust route 55. Alternatively, the tapered surfaces 54d may be provided on both of the surface of the gas-liquid separating plate 54a on the side of the exhaust route 55 and the surface thereof on the side of the substrate rotating unit 20.

Third Embodiment

Figure 11:
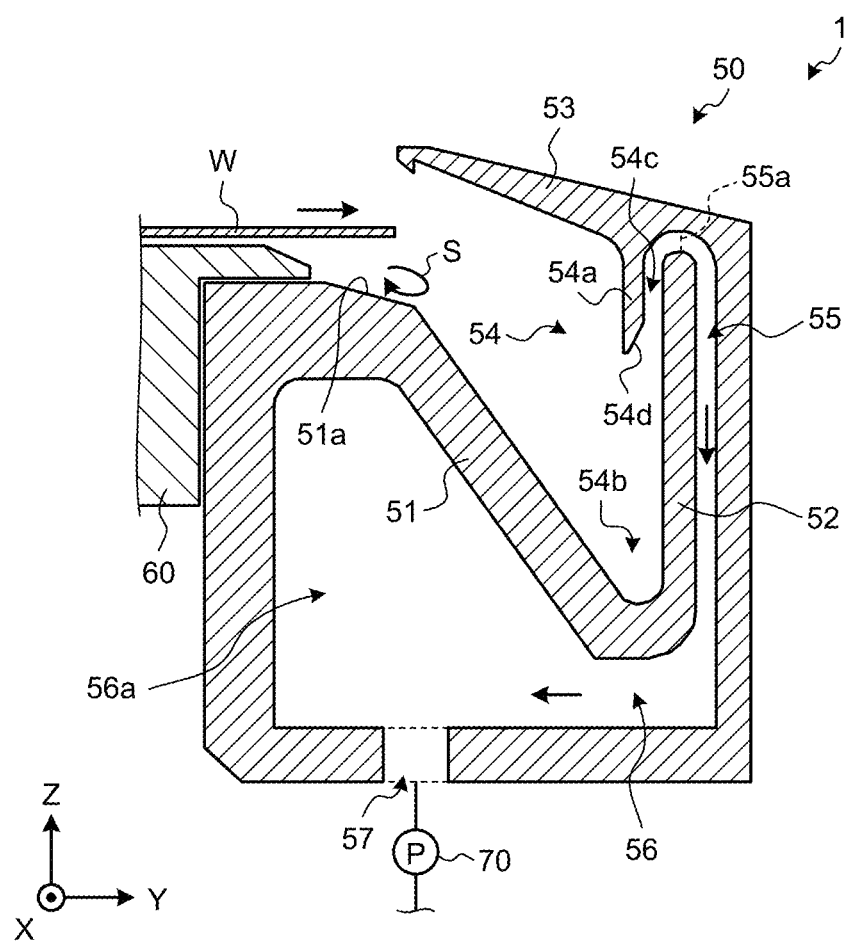
FIG. 11 is a cross-sectional view illustrating the configuration of a recovery unit according to a third embodiment.

Next, the specific configuration of the recovery unit 50 according to a third embodiment will be explained with reference to FIG. 11. FIG. 11 is a cross-sectional view illustrating the configuration of the recovery unit 50 in the third embodiment. As illustrated in FIG. 11, the recovery unit 50 in the third embodiment is different from the second embodiment in the configuration of the lower cup 51.

To be specific, in the third embodiment, the lower cup 51 has a chamfered part 51a. The chamfered part 51a is formed by chamfering a part of the lower cup 51 that faces the peripheral edge of the wafer W.

Formation of the chamfered part 51a in the lower cup 51 in this manner can reduce a space that is formed between the peripheral edge of the wafer W and the lower cup 51 in comparison with the case in which the inclined surface of the lower cup 51 is inclined substantially uniformly over the entire region.

The reduction in the space can reduce the size of vortex flow S that is generated in the space by the flow of the gas toward the exhaust route 55 from the wafer W. According to the third embodiment, the gas can therefore flow smoothly toward the exhaust route 55 from the wafer W.

Formation of the chamfered part 51a in the lower cup 51 can ensure a sufficient space for preferably etching the lower surface peripheral edge in comparison with the case in which a part of the lower cup 51 that faces the peripheral edge of the wafer W is horizontal.

The liquid spattering from the lower cup 51 onto the lower surface peripheral edge of the wafer W can be prevented by ensuring the sufficient space for preferably etching the lower surface peripheral edge. According to the third embodiment, the lower surface peripheral edge of the wafer W can therefore be preferably etched.

Configuration of Exhaust Duct

Figure 12:
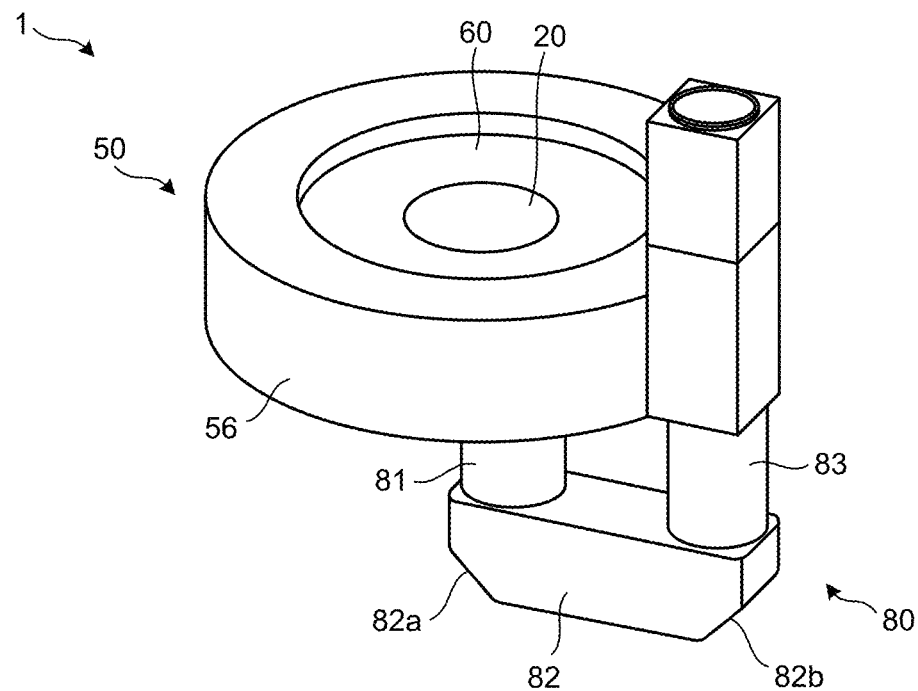
FIG. 12 is a perspective view illustrating the configuration of an exhaust duct in the first embodiment.
Figure 13:
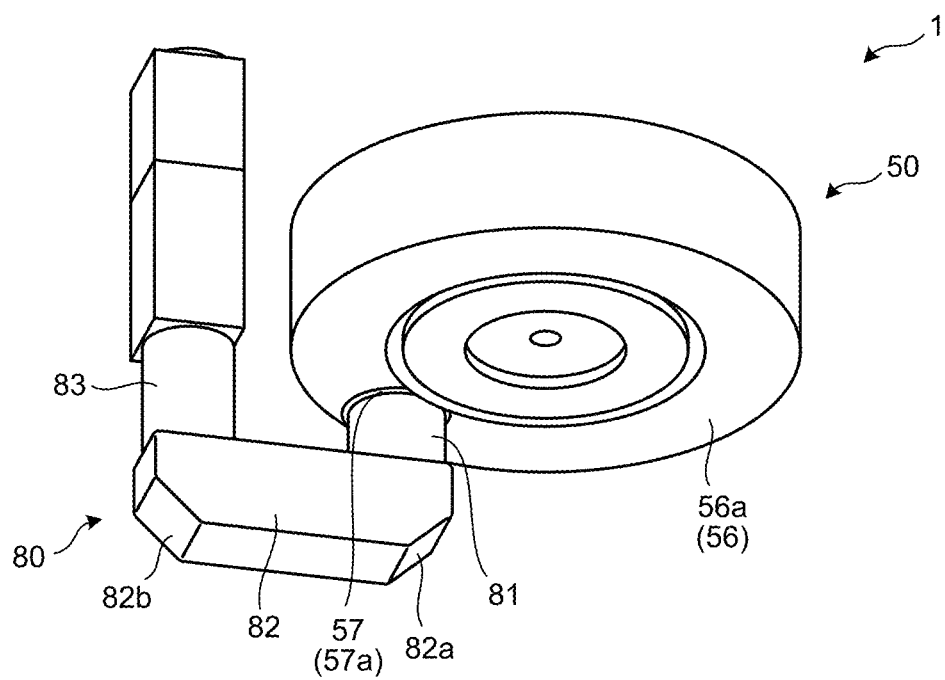
FIG. 13 is a perspective view illustrating the configuration of the exhaust duct in the first embodiment.

Next, the specific configuration of the exhaust duct 80 connected to the recovery unit 50 in the first embodiment will be explained with reference to FIGS. 12 to 13. FIGS. 12 and 13 are perspective views illustrating the configuration of the exhaust duct 80 in the first embodiment.

FIG. 12 is a perspective view when the recovery unit 50 is seen from the obliquely upper side, and FIG. 13 is a perspective view when the recovery unit 50 is seen from the obliquely lower side. In the subsequent drawings, parts other than the substrate rotating unit 20, the recovery unit 50, the heating mechanism 60, and the exhaust duct 80 are not illustrated.

As illustrated in FIG. 13, the exhaust duct 80 is connected to the exhaust port 57 of the recovery unit 50 and discharges the exhaust gas in the buffer 56a to the pump 70 (see FIG. 3). The exhaust duct 80 has a downward unit 81, a horizontal unit 82, and an upward unit 83 in this order from the upstream side.

The downward unit 81 having a cylindrical shape is connected to the exhaust port 57 of the recovery unit 50 and extends downward. The horizontal unit 82 having a box shape is connected to the downstream side of the downward unit 81 and extends in the horizontal direction and the direction away from the recovery unit 50.

The upward unit 83 having a cylindrical shape is connected to the downstream side of the horizontal unit 82 and extends upward. The upward unit 83 extends higher than the recovery unit 50. The exhaust duct 80 does not interfere with the recovery unit 50 even when the upward unit 83 extends higher than the recovery unit 50 because the downstream side of the horizontal unit 82 extends to the outer side of the recovery unit 50 in a plan view.

As described hereinbefore, it is preferable that the exhaust duct 80 in the first embodiment be connected to the lower side of the recovery unit 50 and extend higher than the recovery unit 50. With this configuration, the liquid droplets that have reached the buffer 56a can be prevented from being discharged to the outside through the exhaust duct 80 from the exhaust port 57.

That is to say, in the first embodiment, the liquid droplets that have reached the buffer 56a can be preferably separated by the exhaust duct 80.

In the first embodiment, it is preferable that a chamfered part 57a be provided in the exhaust port 57. That is to say, in the first embodiment, it is preferable that the inner diameter of the upstream-side end of the downward unit 81 of the exhaust duct 80 that is connected to the exhaust port 57 be increased (the downward unit 81 has a diameter increasing part).

With the chamfered part 57a, vortex flow caused by drastic reduction in the cross-sectional area of the flow channel can be prevented from being generated in the exhaust port 57, thereby further reducing the pressure loss in the exhaust port 57. According to the first embodiment, the flow channel resistance of the entire exhaust route from the surroundings of the wafer W to the pump 70 can therefore be further reduced.

In the first embodiment, the horizontal unit 82 of the exhaust duct 80 is preferably formed in the box shape. This enables the exhaust duct 80 to be configured by connecting, to the horizontal unit 82 having the box shape, the downward unit 81 and the upward unit 83 as linear pipes. According to the first embodiment, manufacturing cost of the exhaust duct 80 can therefore be reduced.

In the first embodiment, the horizontal unit 82 having the box shape preferably has an inclined part 82a on the lower side of a part thereof that is connected to the downward unit 81. With the inclined part 82a, vortex flow caused by change in the orientation of the exhaust gas from the downward direction to the horizontal direction can be prevented from being generated in the part of the horizontal unit 82 that is connected to the downward unit 81.

According to the first embodiment, the pressure loss in the exhaust duct 80 can therefore be further reduced, so that the flow channel resistance of the entire exhaust route from the surroundings of the wafer W to the pump 70 can be further reduced.

Furthermore, in the first embodiment, the horizontal unit 82 having the box shape preferably has an inclined part 82b on the lower side of a part thereof that is connected to the upward unit 83. With the inclined part 82b, vortex flow caused by change in the orientation of the exhaust gas from the horizontal direction to the upward direction can be prevented from being generated in the part of the horizontal unit 82 that is connected to the upward unit 83.

According to the first embodiment, the pressure loss in the exhaust duct 80 can therefore be further reduced, so that the flow channel resistance of the entire exhaust route from the surroundings of the wafer W to the pump 70 can be further reduced.

In the first embodiment, the inner diameter of the upward unit 83 may be substantially equal to the inner diameter of the downward unit 81 or larger than the inner diameter of the downward unit 81. In the first embodiment, when the inner diameter of the upward unit 83 is larger than the inner diameter of the downward unit 81, the pressure loss in the exhaust duct 80 can be further reduced.

Moreover, in the first embodiment, the inner dimension of the horizontal unit 82 having the box shape is preferably larger than the inner diameters of the downward unit 81 and the upward unit 83 having the cylindrical shapes. The downward unit 81 and the upward unit 83 can thereby be connected to the horizontal unit 82 with no problem.

On the other hand, when the inner dimension of the horizontal unit 82 is too large relative to the inner diameters of the downward unit 81 and the upward unit 83, much vortex flow is generated due to drastic increase or decrease in the cross-sectional area of the flow channel in a connected part between the downward unit 81 and the horizontal unit 82 and a connected part between the horizontal unit 82 and the upward unit 83. Accordingly, in the first embodiment, the cross-sectional area of the horizontal unit 82 is preferably equal to or less than the double of the cross-sectional areas of the downward unit 81 and the upward unit 83.

Various Alternative Examples of Exhaust Duct

Subsequently, various alternative examples of the exhaust duct 80 in the first embodiment will be explained with reference to FIGS. 14 to 19. In the following various alternative examples, the same reference signs denote the same parts as those in the first embodiment and overlapped explanation thereof is omitted.

Although the first embodiment employs the example in which one exhaust port 57 is provided in the recovery unit 50, a plurality of exhaust ports 57 may be provided in the recovery unit 50.

Figure 14:
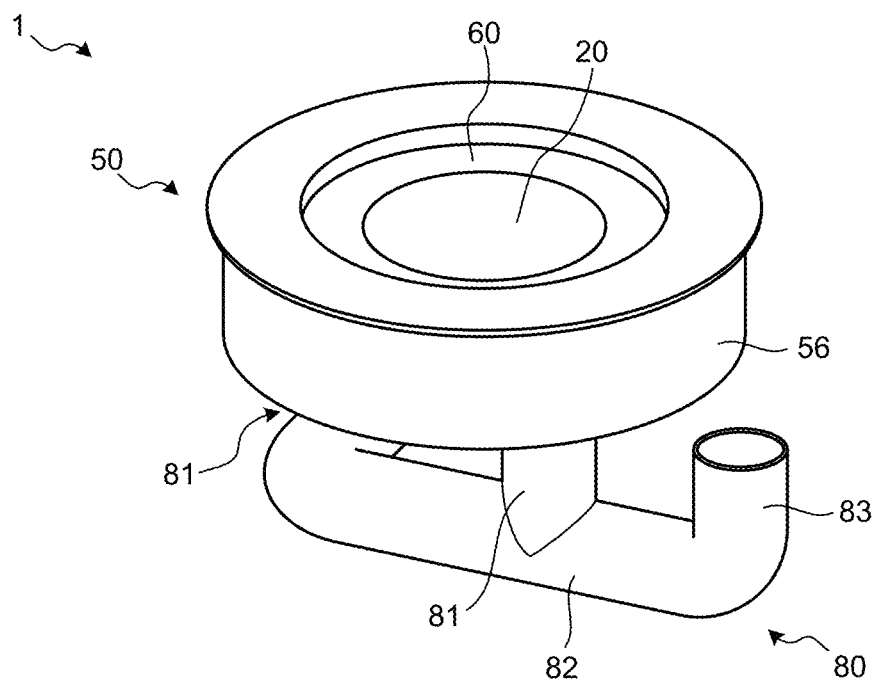
FIG. 14 is a perspective view illustrating the configuration of an exhaust duct according to a third alternative example of the first embodiment.
Figure 15:
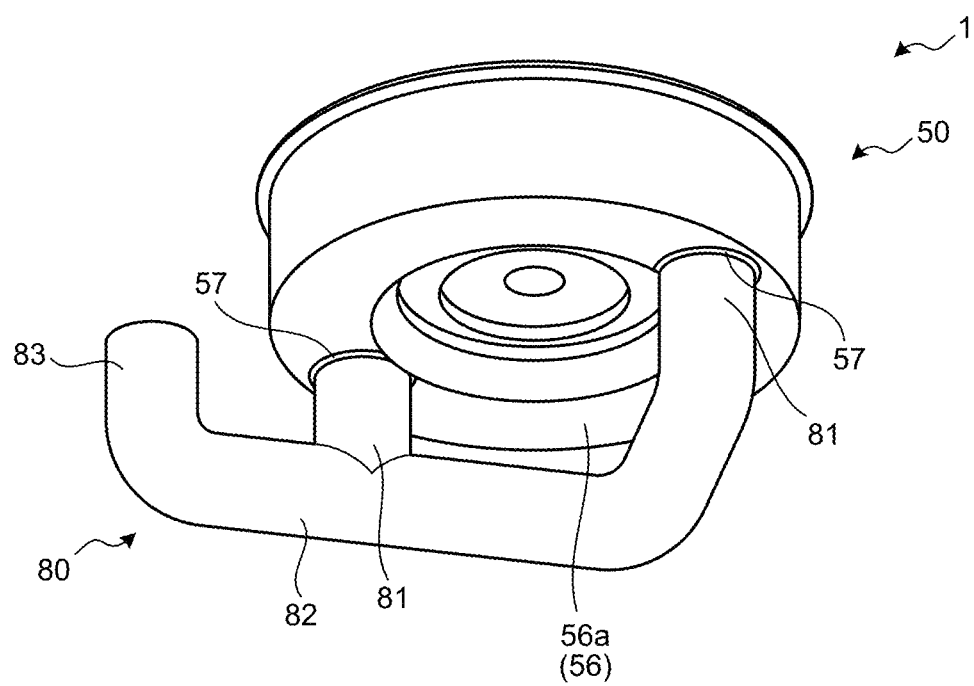
FIG. 15 is a perspective view illustrating the configuration of the exhaust duct in the third alternative example of the first embodiment.

FIGS. 14 and 15 are perspective views illustrating the configuration of the exhaust duct 80 according to a third alternative example of the first embodiment. FIG. 14 is a perspective view when the recovery unit 50 is seen from the obliquely upper side, and FIG. 15 is a perspective view when the recovery unit 50 is seen from the obliquely lower side.

In the third alternative example illustrated in FIGS. 14 and 15, two exhaust ports 57 are provided so as to face each other with the center of the recovery unit 50 interposed therebetween. Exhaust efficiency from the buffer 56a can be improved by providing the exhaust ports 57 in the buffer 56a.

In the third alternative example, the respective downward units 81 are connected to the two exhaust ports 57, and the two downward units 81 merge in one horizontal unit 82. In the third alternative example, the horizontal unit 82 has a cylindrical shape and extends to the outer side of the recovery unit 50 while bypassing so as to avoid the center of the recovery unit 50.

Interference with the substrate rotating unit 20 (see FIG. 2) and the like that are provided at the center of the recovery unit 50 can be prevented by arranging the horizontal unit 82 so as to avoid the center of the recovery unit 50.

Figure 16:
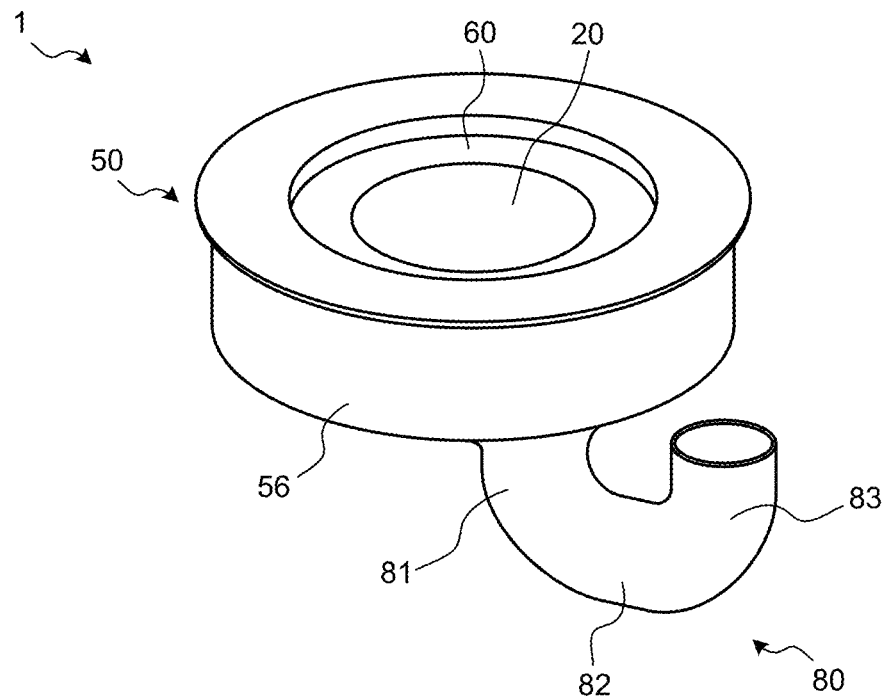
FIG. 16 is a perspective view illustrating the configuration of an exhaust duct according to a fourth alternative example of the first embodiment.
Figure 17:
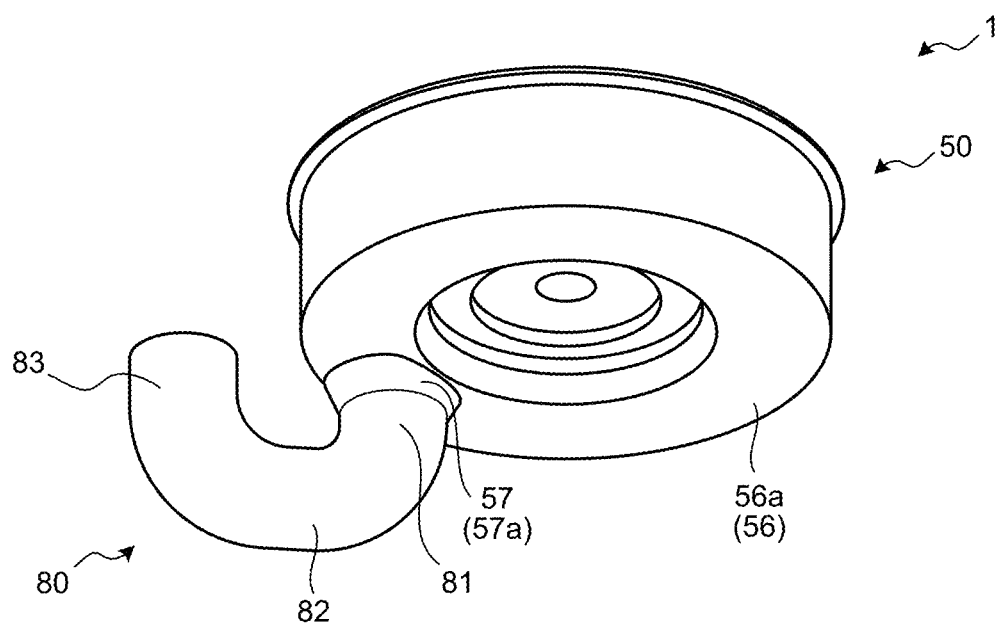
FIG. 17 is a perspective view illustrating the configuration of the exhaust duct in the fourth alternative example of the first embodiment.

FIGS. 16 and 17 are perspective views illustrating the configuration of the exhaust duct 80 according to a fourth alternative example of the first embodiment. FIG. 16 is a perspective view when the recovery unit 50 is seen from the obliquely upper side, and FIG. 17 is a perspective view when the recovery unit 50 is seen from the obliquely lower side.

As illustrated in FIGS. 16 and 17, the exhaust duct 80 in the fourth alternative example is preferably configured such that the downward unit 81, the horizontal unit 82, and the upward unit 83 are connected in a bending manner with the same inner diameter. That is to say, the shape from the downward unit 81 to the upward unit 83 in the exhaust duct 80 in the fourth alternative example is preferably a bending shape.

Vortex flow generated in the exhaust duct 80 can be prevented from being generated by forming the exhaust duct 80 into the bending shape as described above. According to the fourth alternative example, the pressure loss in the exhaust duct 80 can therefore be further reduced, so that the flow channel resistance of the entire exhaust route from the surroundings of the wafer W to the pump 70 can be further reduced.

In the fourth alternative example, the vortex flow generated due to the increase or decrease in the cross-sectional area of the flow channel can be prevented from being generated by configuring the exhaust duct 80 having the cross-sectional area that is not repeatedly increased and decreased.

According to the fourth alternative example, the pressure loss in the exhaust duct 80 can therefore be further reduced, so that the flow channel resistance of the entire exhaust route from the surroundings of the wafer W to the pump 70 can be further reduced.

As illustrated in FIG. 17, it is preferable that in the exhaust duct 80 in the fourth alternative example, the chamfered part 57a be provided in the exhaust port 57. With the chamfered part 57a, vortex flow caused by drastic reduction in the cross-sectional area of the flow channel can be prevented from being generated in the exhaust port 57, thereby further reducing the pressure loss in the exhaust port 57.

According to the fourth alternative example, the flow channel resistance of the entire exhaust route from the surroundings of the wafer W to the pump 70 can therefore be further reduced.

Although the first embodiment and the third and fourth alternative examples employ the example in which the exhaust duct 80 is connected to the lower side of the recovery unit 50, a part to which the exhaust duct 80 is connected is not limited to the lower side of the recovery unit 50.

Figure 18:
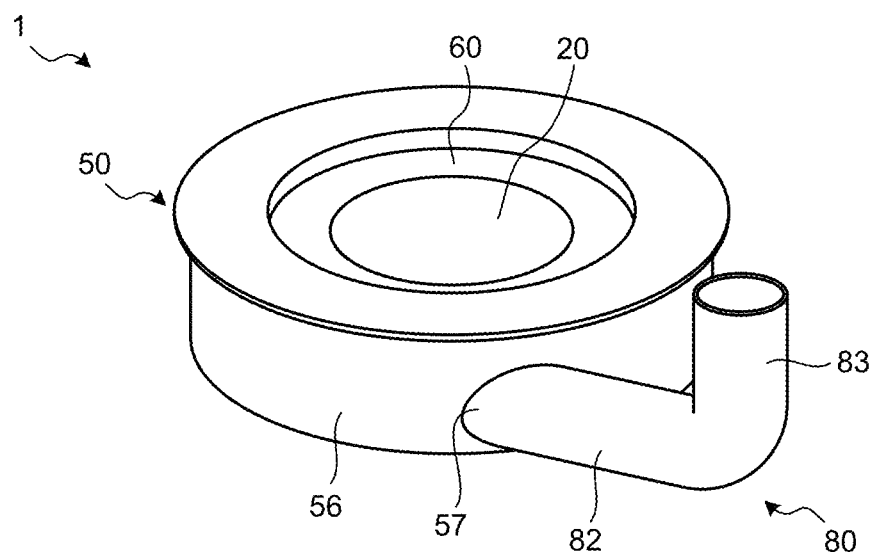
FIG. 18 is a perspective view illustrating the configuration of an exhaust duct according to a fifth alternative example of the first embodiment.
Figure 19:
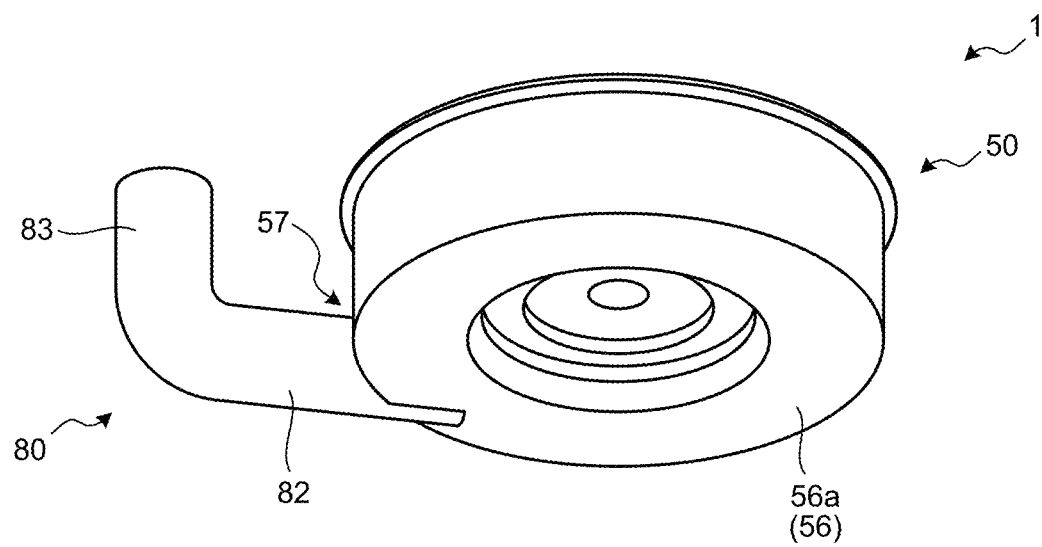
FIG. 19 is a perspective view illustrating the configuration of the exhaust duct in the fifth alternative example of the first embodiment.

FIGS. 18 and 19 are perspective views illustrating the configuration of the exhaust duct 80 according to a fifth alternative example of the first embodiment. FIG. 18 is a perspective view when the recovery unit 50 is seen from the obliquely upper side, and FIG. 19 is a perspective view when the recovery unit 50 is seen from the obliquely lower side.

As illustrated in FIGS. 18 and 19, the exhaust duct 80 in the fifth alternative example is connected to the exhaust port 57 formed on the side surface of the recovery unit 50. That is to say, in the fifth alternative example, the horizontal unit 82 of the exhaust duct 80 is connected to the lateral side of the recovery unit 50.

Even in this case, gas can be efficiently exhausted from the buffer 56a by providing the exhaust port 57 so as to be adjacent to the buffer 56a.

The substrate processing apparatus 1 in the embodiment includes the substrate rotating unit 20, the gas-liquid separator 54, and the exhaust route 55. The substrate rotating unit 20 is configured to hold and rotate the substrate (wafer W). The gas-liquid separator 54 is provided so as to surround the outer circumference of the substrate rotating unit 20 and configured to separate the gas and the liquid droplets. The exhaust route 55 is provided so as to surround the outer circumference of the gas-liquid separator 54 and configured to exhaust the gas separated by the gas-liquid separator 54. With this configuration, the peripheral edge of the wafer W can be etched with high accuracy.

In the substrate processing apparatus 1 in the embodiment, the gas-liquid separator 54 has the gas-liquid separating plate 54a extending downward so as to separate the substrate rotating unit 20 and the entrance 55a of the exhaust route 55. With the gas-liquid separating plate 54a, the liquid droplets that hit the upper cup 53 or flow directly toward the entrance 55a of the exhaust route 55 can be separated preferably.

In the substrate processing apparatus 1 in the embodiment, the gas-liquid separating plate 54a has the tapered surface 54d formed on the leading end. The gas can therefore flow smoothly toward the exhaust route 55 from the surroundings of the wafer W.

In the substrate processing apparatus 1 in the embodiment, the tapered surface 54d is provided on the surface of the gas-liquid separating plate 54a on the side of the exhaust route 55. The peripheral edge of the wafer W can thereby be etched with higher accuracy.

In the substrate processing apparatus 1 in the embodiment, the lower end of the gas-liquid separating plate 54a is provided at the position lower than the lower end of the entrance 55a of the exhaust route 55 or the position that is flush with the lower end of the entrance 55a of the exhaust route 55. The liquid droplets that hit the upper cup 53 or flow directly toward the entrance 55a of the exhaust route 55 can thereby be separated more preferably.

The substrate processing apparatus 1 in the embodiment further includes the lower cup 51 receiving the liquid droplets below the substrate (wafer W). The lower cup 51 has the chamfered part 51a below the substrate (wafer W). The gas can therefore flow smoothly toward the exhaust route 55 from the wafer W, and the lower surface peripheral edge of the wafer W can be etched preferably.

The substrate processing apparatus 1 in the embodiment further includes the connection route 56 connected to the downstream side of the exhaust route 55. The cross-sectional area of the connection route 56 is larger than the cross-sectional area of the exhaust route 55. The peripheral edge of the wafer W can therefore be etched with higher accuracy.

In the substrate processing apparatus 1 in the embodiment, the exhaust route 55 extends vertically from the entrance 55a. The recovery unit 50 can therefore be reduced in size.

The substrate processing apparatus 1 in the embodiment includes the recovery unit 50 having the gas-liquid separator 54 and the exhaust route 55 and configured to recover the liquid droplets spattering from the substrate (wafer W), and the exhaust duct 80 connected to the exhaust port 57 formed on the downstream side of the exhaust route 55 in the recovery unit 50. With this configuration, the peripheral edge of the wafer W can be etched with high accuracy.

In the substrate processing apparatus 1 in the embodiment, the exhaust duct 80 is connected to the lower side of the recovery unit 50 and extends higher than the recovery unit 50. The liquid droplets that have reached the buffer 56a can therefore be preferably separated by the exhaust duct 80.

In the substrate processing apparatus 1 in the embodiment, the exhaust port 57 has the chamfered part 57a. The flow channel resistance of the entire exhaust route from the surroundings of the wafer W to the pump 70 can therefore be further reduced.

In the substrate processing apparatus 1 in the embodiment, the cross-sectional area of the exhaust duct 80 is not increased and decreased repeatedly. The flow channel resistance of the entire exhaust route from the surroundings of the wafer W to the pump 70 can therefore be further reduced.

Although the embodiments of the present disclosure have been explained above, the present disclosure is not limited to the above-mentioned embodiments and various changes can be made without departing from the scope thereof. For example, although the above-mentioned embodiments employ the example in which the tapered surface 54d is provided on at least one of the surface of the gas-liquid separating plate 54a on the side of the exhaust route 55 and the surface thereof on the side of the substrate rotating unit 20, the tapered surface 54*d* may not be necessarily provided on the gas-liquid separating plate 54*a*.

The above-mentioned embodiment employs the example in which the exhaust duct 80 is connected to the recovery unit 50 in the first embodiment. Alternatively, the exhaust duct 80 may be connected to the recovery unit 50 in the second embodiment or the third embodiment.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate processing apparatus comprising:
a substrate rotator to hold and rotate a substrate;
a gas-liquid separator provided so as to be separated from the substrate rotator and surround an outer circumference of the substrate rotator to separate gas and liquid droplets; and
an exhaust route provided so as to surround an outer circumference of the gas-liquid separator to exhaust the gas separated by the gas-liquid separator,
wherein the gas-liquid separator has a gas-liquid separating plate in front of an entrance of the exhaust route extending downward perpendicularly to the entrance of the exhaust route so as to separate the substrate rotator and the entrance of the exhaust route, wherein the gas-liquid separating plate has a tapered surface formed on a leading end,
the gas-liquid separating plate separates the gas and liquid droplets, and
the exhaust route exhausts the gas separated by the gas-liquid separating plate.

2. The substrate processing apparatus according to claim 1, wherein the tapered surface is provided on a surface of the gas-liquid separating plate on a side of the exhaust route.

3. The substrate processing apparatus according to claim 1, wherein a lower end of the gas-liquid separating plate is provided at a position lower than a lower end of the entrance of the exhaust route or a position that is flush with the lower end of the entrance of the exhaust route.

4. The substrate processing apparatus according to claim 1, further comprising a lower cup receiving the liquid droplets below the substrate, wherein
the lower cup has a chamfered part below the substrate.

5. The substrate processing apparatus according to claim 1, further comprising a connection route connected to a downstream side of the exhaust route, wherein
a cross-sectional area of the connection route is larger than a cross-sectional area of the exhaust route.

6. The substrate processing apparatus according to claim 1, wherein the exhaust route extends vertically from an entrance.

7. The substrate processing apparatus according to claim 1, comprising:
a recovery structure including the gas-liquid separator and the exhaust route to recover the liquid droplets spattering from the substrate, and
an exhaust duct connected to an exhaust port formed on a downstream side of the exhaust route in the recovery structure.

8. The substrate processing apparatus according to claim 7, wherein a cross-sectional area of the exhaust duct is not increased and decreased repeatedly.

9. A substrate processing apparatus comprising:
a substrate rotator to hold and rotate a substrate;
a gas-liquid separator provided so as to surround an outer circumference of the substrate rotator to separate gas and liquid droplets;
an exhaust route provided so as to surround an outer circumference of the gas-liquid separator to exhaust the gas separated by the gas-liquid separator,
a recovery structure including the gas-liquid separator and the exhaust route to recover the liquid droplets spattering from the substrate, and
an exhaust duct connected to an exhaust port formed on a downstream side of the exhaust route in the recovery structure, wherein the exhaust duct is connected to a lower side of the recovery structure and extends higher than the recovery structure.

10. A substrate processing apparatus comprising:
a substrate rotator to hold and rotate a substrate;
a gas-liquid separator provided so as to surround an outer circumference of the substrate rotator to separate gas and liquid droplets;
an exhaust route provided so as to surround an outer circumference of the gas-liquid separator to exhaust the gas separated by the gas-liquid separator,
a recovery structure including the gas-liquid separator and the exhaust route to recover the liquid droplets spattering from the substrate, and
an exhaust duct connected to an exhaust port formed on a downstream side of the exhaust route in the recovery structure, wherein the exhaust port has a chamfered part,
wherein the gas-liquid separator has a gas-liquid separating plate in front of an entrance of the exhaust route extending downward perpendicularly to the entrance of the exhaust route so as to separate the substrate rotator and the entrance of the exhaust route.

* * * * *